United States Patent
Tohyama et al.

[11] Patent Number: 6,045,382
[45] Date of Patent: Apr. 4, 2000

[54] SOCKET APPARATUS FOR IC PACKAGES

[75] Inventors: Masao Tohyama; Hideki Sano, both of Gotemba, Japan

[73] Assignee: Texas Instruments Incorporated, Dallas, Tex.

[21] Appl. No.: 08/971,383

[22] Filed: Nov. 17, 1997

[30] Foreign Application Priority Data

Dec. 13, 1996 [JP] Japan .................................. 8-352895

[51] Int. Cl.[7] .................................................. H01R 11/22
[52] U.S. Cl. ............................................ 439/266; 439/331
[58] Field of Search .................................. 439/259–270, 439/330, 331, 70–73

[56] References Cited

U.S. PATENT DOCUMENTS

| | | | |
|---|---|---|---|
| 4,846,704 | 7/1989 | Ikeya ........................................ | 439/72 |
| 5,020,998 | 6/1991 | Ikeya et al. ............................. | 439/266 |
| 5,304,072 | 4/1994 | Kunioka et al. ........................ | 489/266 |
| 5,320,551 | 6/1994 | Mori et al. ............................... | 439/72 |
| 5,364,284 | 11/1994 | Tohyama et al. ....................... | 439/266 |
| 5,409,392 | 4/1995 | Marks et al. ............................ | 439/266 |
| 5,447,444 | 9/1995 | Matsuoka ................................ | 439/266 |
| 5,658,153 | 8/1997 | Ikeya et al. ............................. | 439/266 |
| 5,800,194 | 9/1998 | Yamagishi .............................. | 439/266 |

*Primary Examiner*—Hien Vu
*Attorney, Agent, or Firm*—Russell E. Baumann; Richard L. Donaldson

[57] ABSTRACT

An IC seating portion (14) of a socket (2) for a semiconductor device (300) is arranged so that the IC terminal leads can engage with contact heads (22) of contact pins (20) mounted in the socket. Each contact pin (20) is arranged in a respective slit (8) formed by partition members (7) providing electrically isolation of the contact pins from one another. Socket (2) has a blocking member (3) which blocks the gaps or slits at their top to prevent IC terminal leads from becoming entangled with the slits or contact pins (20). A stop member (4) is formed in the IC seating portion (14) to facilitate positioning of a semiconductor device (300) on the seating portion and to prevent the IC terminal leads from interfering with contact pins (20).

6 Claims, 7 Drawing Sheets

SOCKET APPARATUS FOR IC PACKAGES

FIELD OF THE INVENTION

This invention relates generally to a socket which enables the testing of an electrical part such as an integrated circuit (IC) package by causing contact pins to engage respective terminal leads of the electric part and more particularly to a socket for use with an electric part having easily bendable terminal leads.

BACKGROUND OF THE INVENTION

As part of the manufacturing process for making semiconductor devices, after sealing selected integrated circuits with resin, ceramic, or the like, it is conventional to subject the devices to various functional tests including a burn-in test to determine whether they are satisfactory or unsatisfactory products. Since a large number of semiconductor devices are handled in connection with such tests, a socket in which the devices can be easily inserted and removed is used, thereby making it possible to change the semiconductor devices, one after another in order to efficiently carrying out the testing. In view of the large number of packages and lead configurations of the semiconductor devices, the configuration of the sockets that are used vary accordingly.

Figure 4A:
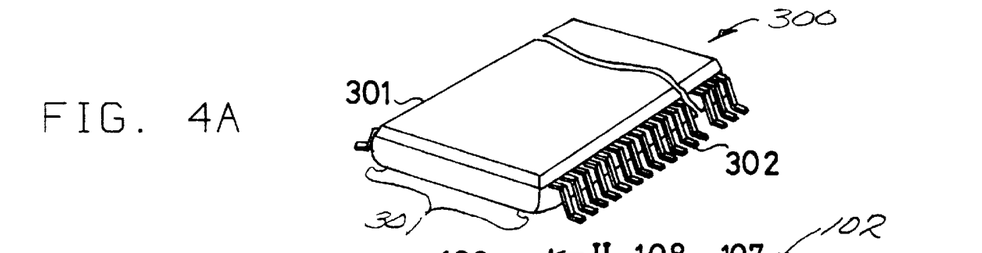
FIG. 4a is a perspective view of a semiconductor device of the TSOP type.
Figure 4B:
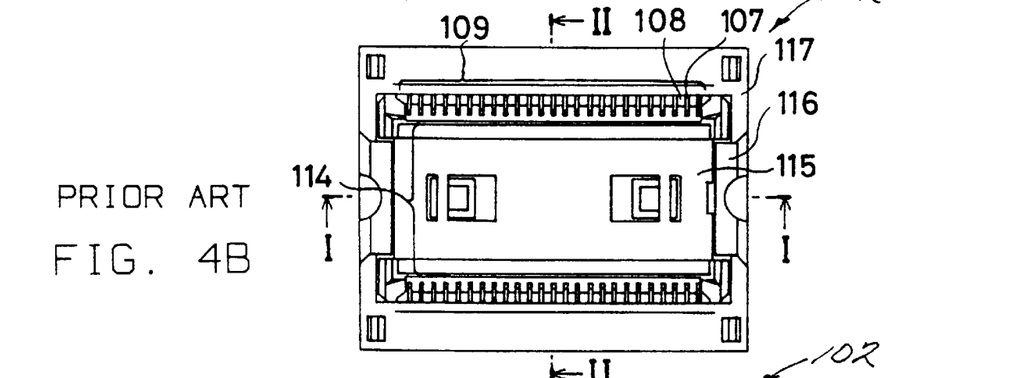
FIG. 4b is a top plan view of a socket according to conventional technology.
Figure 4C:
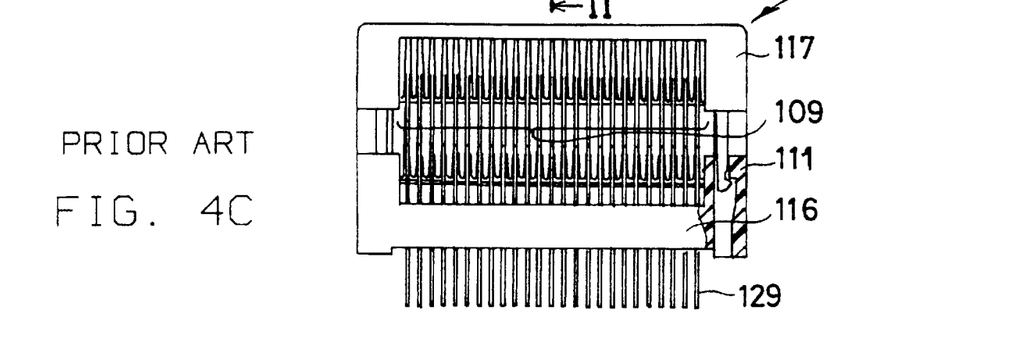
FIGS. 4c and 4d are a front elevational view partly in cross section and a side elevational view, respectively, of the FIG. 4b socket.
Figure 4D:
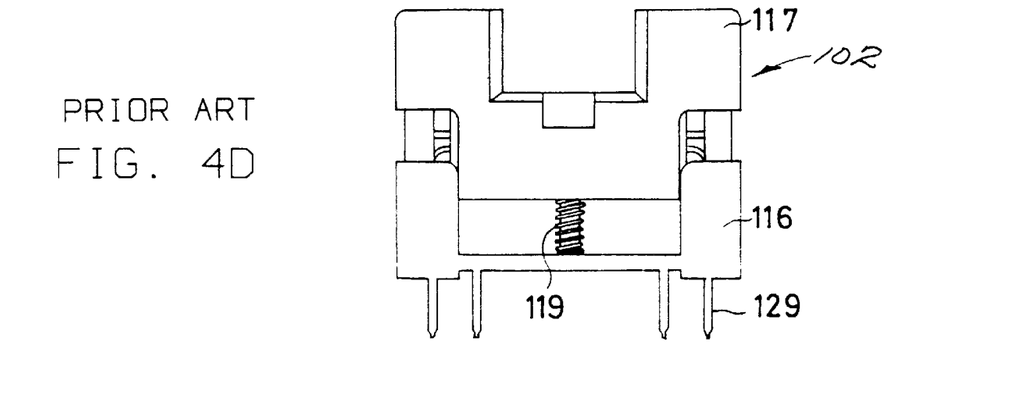
Figure 5A:
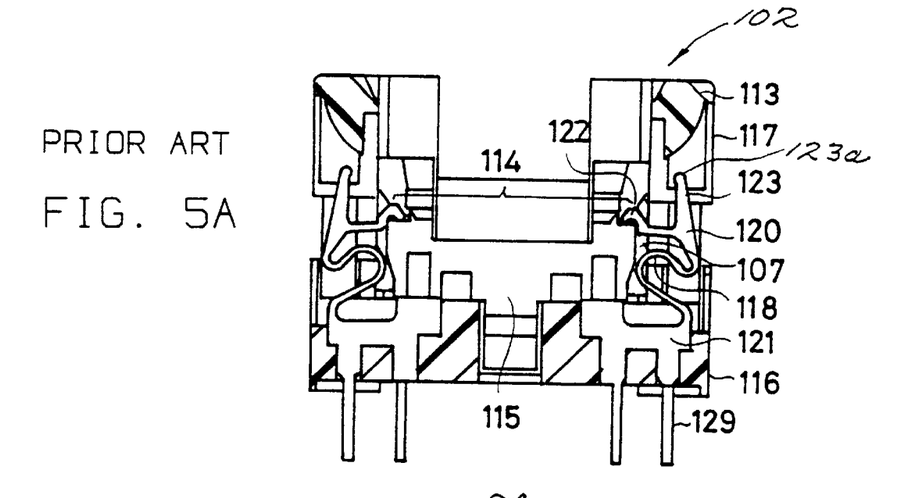
FIGS. 5a through 5c are side cross sectional views of a prior art socket shown for the purpose of describing the manner in which a semiconductor device is inserted into the socket.

Reference character 300 in FIG. 4a indicates a semiconductor device of the TSOP (thin small outline package) type. Numeral 102 in FIGS. 4b through 4d refers to a socket made according to the prior art often used in testing of such semiconductor devices. Socket 102 comprises a base 116, a cover 117 and an adaptor 115, all formed of electrically insulating material, and contact pins 120 formed of a copper alloy material. After cover 117 has been installed on base 116 in such a manner as to be vertically movable relative to the base, adaptor 115 is inserted into the recessed portion formed at the center of base 116 to provide a rectangular shaped seating portion 114 in socket 102. Section 109, comprising a plurality of slits or gaps 108, is arranged along the edges of two sides in the longitudinal direction of seating portion 114. Slits 108 are formed between partitions 107 that have been arranged equally spaced from one another along the two sides of base 116 with the top part of slits 108 being open. A contact pin 120 is arranged in each slit 108, shown in FIGS. 5a through 5c. Each contact pin 120 has a pedestal 121, a leg part 129 extending from the lower part of pedestal 121 and a flexible spring part 118 provided at the top of the contact pin. Contact pins 120 are inserted, one by one, from the top into each slit 108 prior to mounting cover 117 on base 116 with leg part 129 extending out of the bottom of base 116. Contact heads 122 and trigger portions 123 are provided at the tip of flexible spring part 118. When cover 117 is raised, contact heads 122 engage the surface of adapter 115 with a force provided by flexible spring parts 118. A spring 119 (FIG. 4d) is disposed between base 116 and cover 117 and a latch mechanism 111 (FIG. 4c) is provided on the base and the cover. Spring 119 urges cover 117 toward the raised position with its movement limited by latch mechanism 111. Trigger portions 123 of contact pins 120 are located outside of slits 108 and the distal tip parts 123a are out of engagement with cam member 113 formed in cover 117 when the cover is in the raised position (FIG. 5a).

Figure 5B:
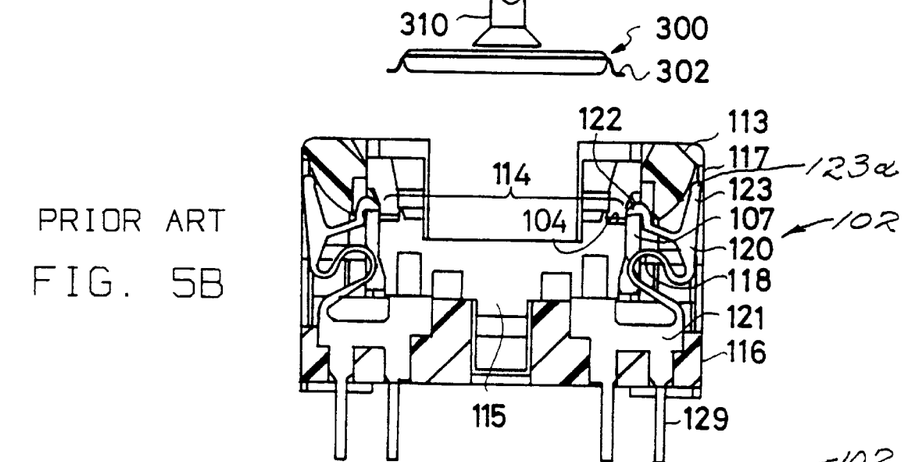
Figure 5C:
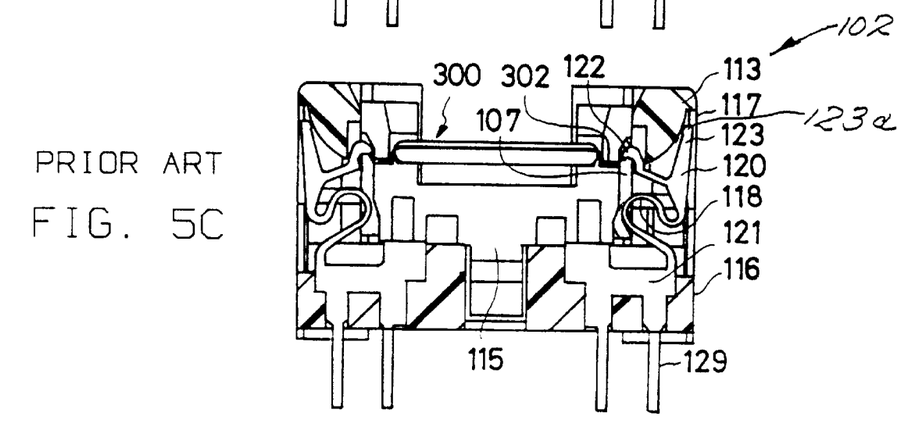
Figure 5D:
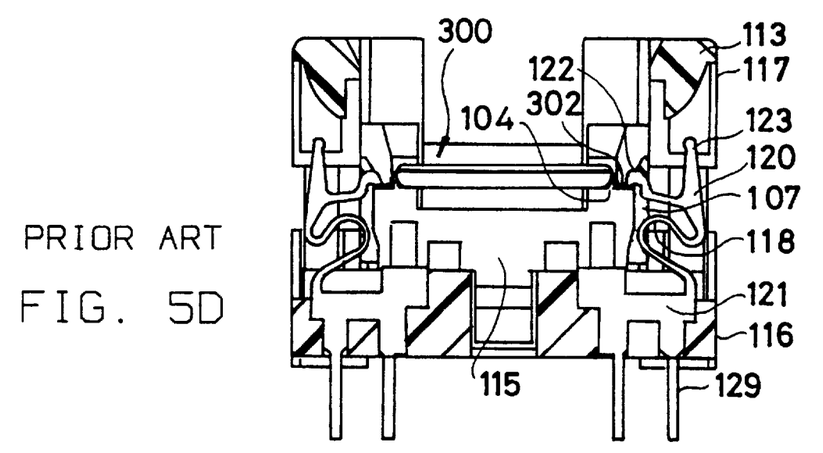
FIGS. 5d through 5f are views similar to FIGS. 5a through 5c shown for the purpose of describing the manner in which the semiconductor device is removed from the socket.
Figure 5E:
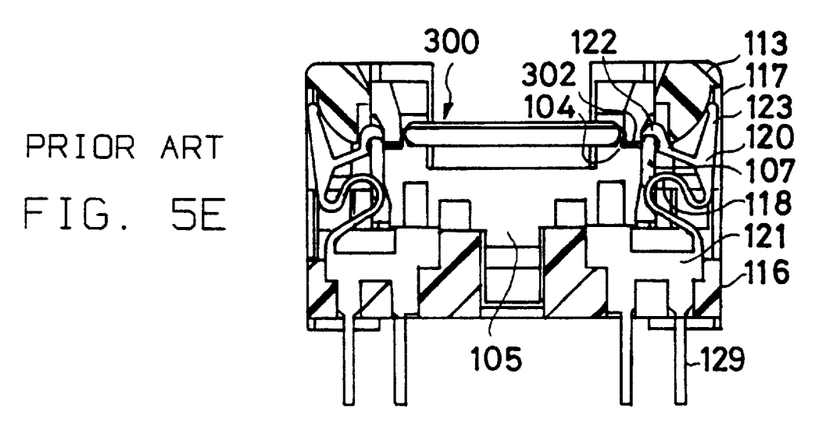
Figure 5F:
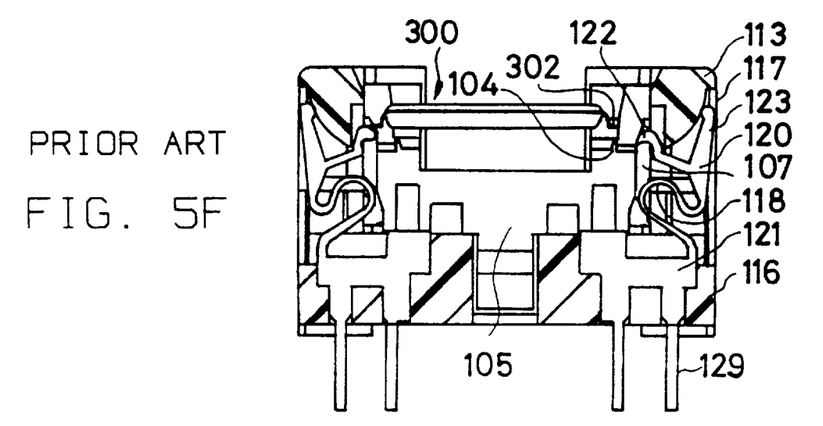
Figure 6A:
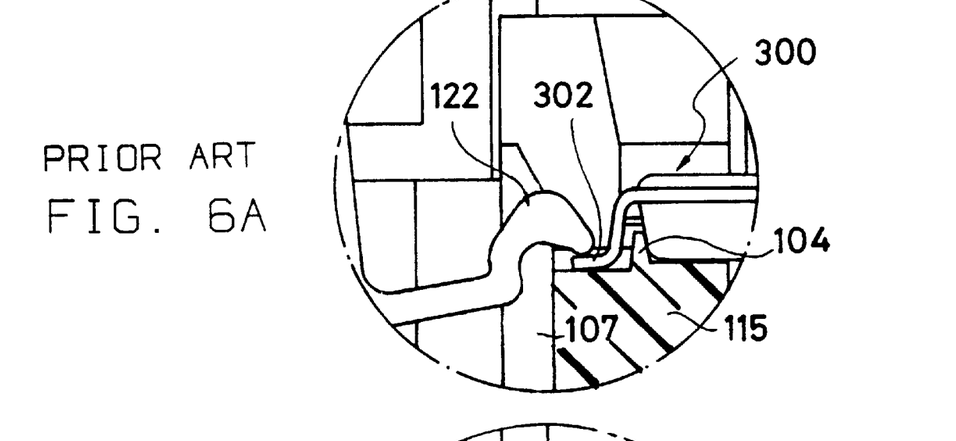
FIGS. 6a through 6c are enlarged views of the contact head portion of a contact in the prior art socket.
Figure 6B:
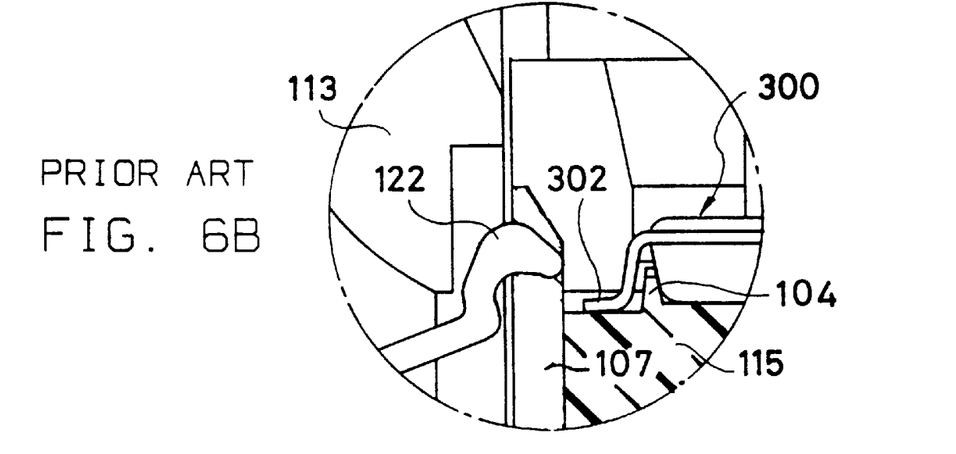
Figure 6C:
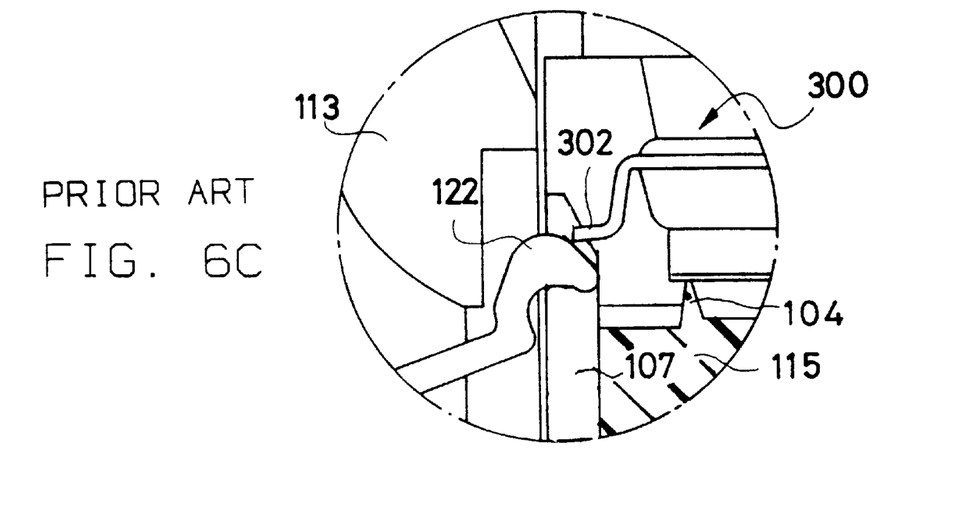

When cover 117 is depressed in opposition to the spring force of spring 119, cam member 113 engages tip part 123a of trigger portion 123. When the cover is depressed further, cam member 113 moves downwardly while maintaining sliding engagement with tip parts 123a of trigger portions 123 and, as shown in FIG. 5b, the trigger parts 123 are forced outwardly. Concomitantly, flexible spring parts 118 are bent and contact heads 122 move outwardly and upwardly, away from the surface of adaptor 115, with a result that contact heads 122 are received in slits 108 as shown in FIG. 5b. When socket 102 is in the FIG. 5b position, a semiconductor device 300, held horizontally relative to socket 102 by a vacuum pick 310 with terminal leads 302 facing downwardly, can be dropped into the seating portion 114 through the opening at the center of cover 117. If the semiconductor device 300 is dropped straight down, the outer edges of package 301 engage platform member 104 on the surface of adaptor 115 and device 300 is thereby received on seating portion 114. If the downward force on the cover is released in this state, cover 117 is raised by the force of spring 119 with cam member 113 moving upwardly. Trigger portions 123 separate from cam member 113 with a result that the spring force of flexible part 118 causes contact head 122 to move from inside slits 108 downwardly and inwardly returning to their original state. When cover 117 has been completely raised, contact heads 122 engage respective terminal leads 302, as shown in FIG. 5d, thereby making it possible for an electrical test to be conducted. An enlarged view of the vicinity of a contact head 122 and a respective terminal lead 302 is shown in FIG. 6a. After completion of the test, cover 117 is pushed down and contact heads 122 are received in respective slits 108, thereby making it possible for the semiconductor device 300 to be removed (see FIG. 5e). An enlarged view of the vicinity of a terminal lead 302 at this stage is shown in FIG. 6b. When the top of semiconductor 300 is picked up by vacuum pack 310 and raised vertically, the semiconductor device can be removed from inside socket 102.

However, there are cases where a semiconductor device 300 is inserted askew or moves horizontally at the time of removal and can become entangled in section 109. Since the distance between the slits of socket 102, or the distance between the contact pins 120, is wider than the tip of a terminal lead 302 a terminal inserted askew or moved horizontally due to inaccurate positioning, can become caught in a slit 108 when the tip of a terminal lead 302 happens to engage slit section 109. Terminal leads of semiconductor devices have become thinner and thinner in recent years, with a result that such terminals tend to be easily bent by external forces thereby exacerbating the problem. In instances where the tip of the terminal lead 302 becomes entangled in a slit 108 and the terminal lead is bent, as described above, it then becomes impossible to reliably connect semiconductor device 300 to a printed substrate, thereby producing an unsatisfactory product. In view of the finer pitch of terminal leads, on the other hand, the accurate positioning of the terminal lead and the semiconductor device has become all the more critical.

SUMMARY OF THE INVENTION

An object of the present invention is to overcome the above noted prior art limitations. Another object of the invention is the provision of a socket in which the terminal leads of an electric part will not become entangled in the slits or with the contact pins of the socket. Other objects, advantages and details of the socket of this invention appear in the following detailed description of the preferred embodiment of the invention.

Briefly described, a socket made in accordance with the invention comprises a base, a seating portion on the base for a semiconductor device having a plurality of terminal leads, a slit forming partition means for forming a plurality of slits on at least two opposing sides of the seating portion, a plurality of contact pins with one in each respective slit having head portions movable toward and away from the seating portion which are, respectively, electrically connectable with the plurality of terminal leads and a slit blocking means that blocks one end of the plurality of slits. According to a feature of the invention, the head portions of the contact pins move into the slits in connection with the removal of the semiconductor device from the seating portion. According to another feature, an inclined guide surface is provided on the blocking means for guiding the semiconductor device to the seating portion. According to yet another feature of the invention, a stop member is provided adjacent to the slits and serves as an aid in positioning the tips of the terminal leads of the semiconductor device when it is received on the seating portion so that the positioning of the semiconductor device is effected as the tip of the terminal leads engage the stop member. A cover is movably mounted on the base and has a cam surface for engaging a trigger portion of the contact pins and for moving the trigger portions and head portions in dependence upon movement of the cover.

A semiconductor device to be tested is inserted through an opening formed in the cover and placed on the seating portion. The contact pins are moved by moving the cover, thereby causing the contact heads of the pins to engage the terminal leads and, thus, making it possible to conduct a test on the semiconductor device. Upon completion of the test, the contact heads are separated from the terminal leads, the semiconductor device is removed from the socket and exchanged with another semiconductor device.

In loading the socket with a semiconductor device even when the tip of a terminal lead engages the slit section during the insertion of the semiconductor device, the blocking means will prevent entry and entanglement of terminal leads inside the slits. The inclined guide surface on the blocking means guides the semiconductor device to a preselected location in connection with the insertion of the semiconductor device so that insertion becomes easier to achieve and any possible bending of the terminal lead in connection with the insertion is avoided. The stop member provided in the vicinity of the location where the tip of the terminal lead of the semiconductor device is received on the seating portion further aids in preventing entanglement of the tip of a terminal lead in a slit.

DETAILED DESCRIPTION OF PREFERRED EMBODIMENT

Figure 1A:
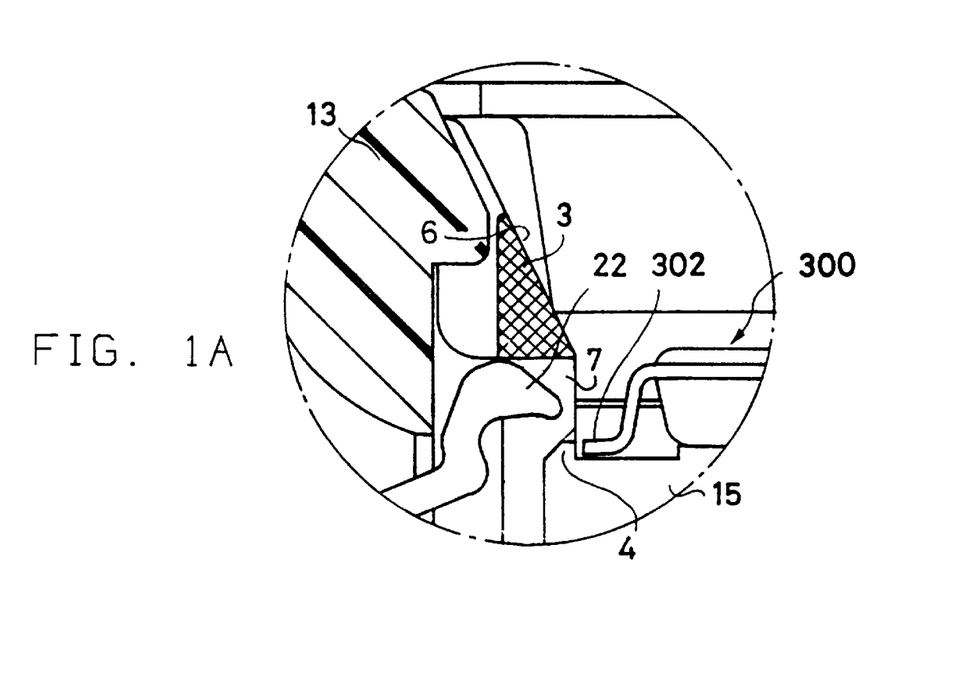
FIGS. 1a and 1b are side cross sectional views of a portion of a socket made according to the invention shown for the purpose of describing the blocking means of the socket.
Figure 1B:
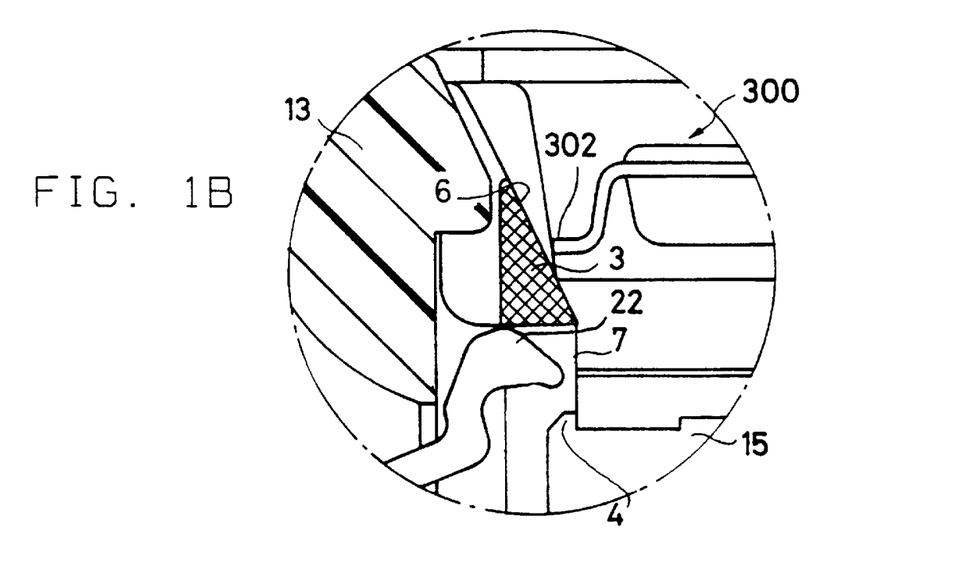
Figure 2A:
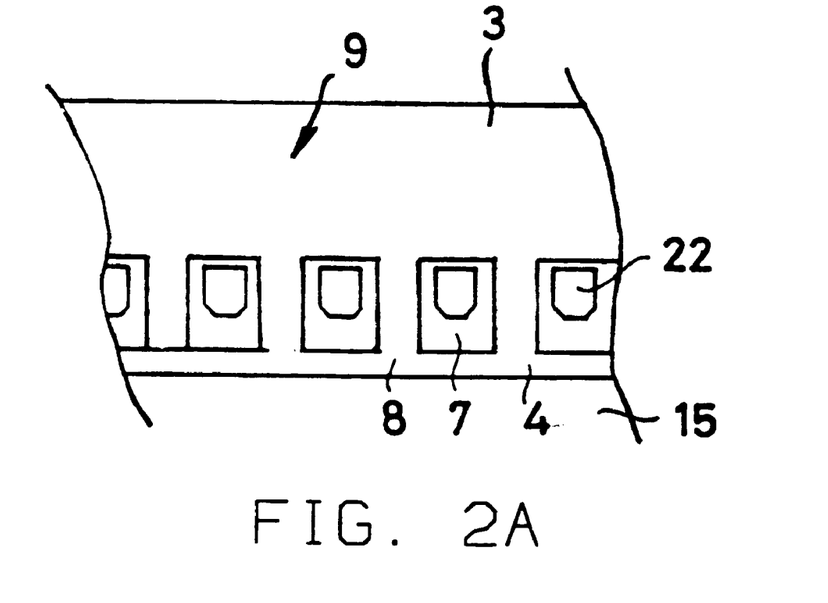
FIG. 2a is a front view of a portion of the slit section including the blocking means made in accordance with the invention and FIG. 2b is a front view of a portion of a slit section of a socket made according to the prior art.
Figure 3A:
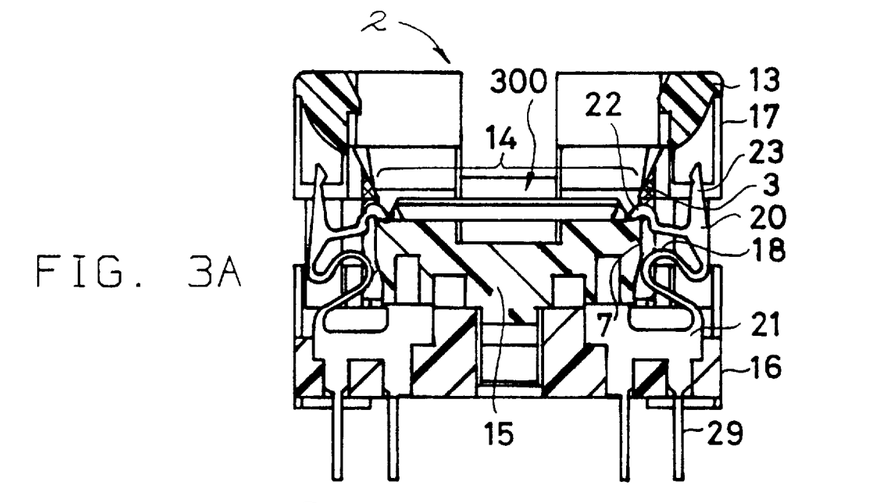
FIGS. 3a through 3c are side cross sectional views of a socket made in accordance with the invention shown for the purpose of describing the procedure for inserting a semiconductor device into the socket.
Figure 3B:
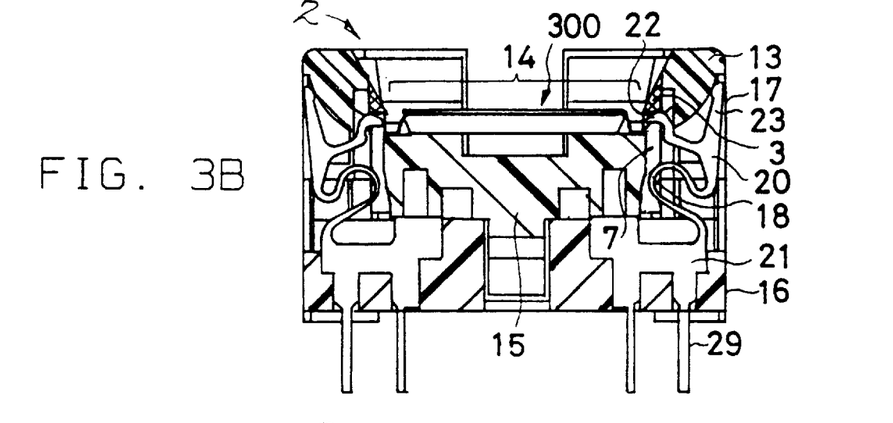
Figure 3C:
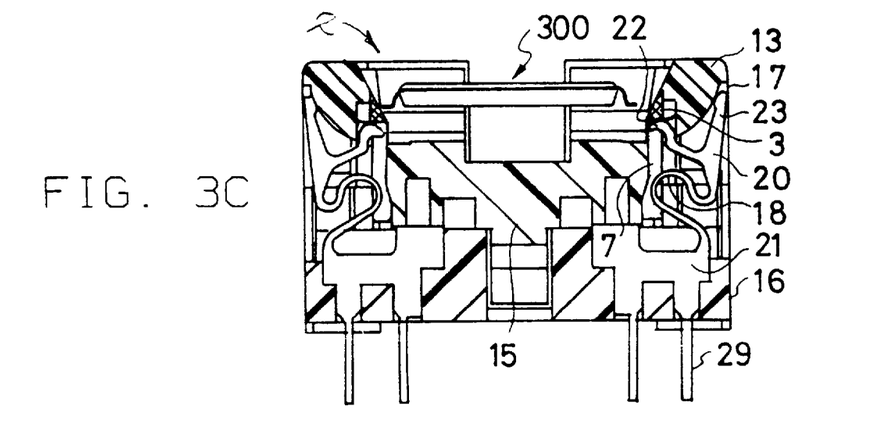

Referring to FIGS. 1a, 1b and 3a–3c, numeral 2 indicates a socket made according to a preferred embodiment of this invention. Socket 2 accommodates a semiconductor device (i.e., an electric part) of the TSOP (thin small outline package) type as shown in FIG. 4a in such a manner that it can be easily inserted and removed. Socket 2 comprises a base 16, a cover 17 and an adaptor 15 all made of an electrically insulating material such as a resin and contact pins 20 formed of copper alloy. After mounting cover 17 on base 16 in such a manner as to be vertically movable relative to the base, an adaptor 15 is inserted through an opening provided at the center of cover 17 onto base 16. The upper surface of adaptor 15 forms a seating portion 14 in a generally rectangular shape. The semiconductor device 300 is vertically dropped through the opening of cover 17 for seating. A spring (not shown in the drawing), similar to the above described spring 119, is provided between base 16 and cover 17 which biases the cover away from the base. Socket 2 has a plurality of slit forming means or partitions 7 formed integrally with base 16. Partitions 7 are equally spaced apart along the edges of the two sides in the longitudinal direction of seating portion 14 of adaptor 15 with a gap or slit 8 being formed between respective partitions as is shown in FIG. 2a. Partitions 7 and slits 8 comprise slit section 9 in FIG. 2a. A blocking member 3, formed of electrically insulating material, is disposed at the top of slit section 9, blocking entry into slits 8 from above. Contact pin 20 (of the same shape as the above described contact pin 120) is formed from a thin sheet of a copper alloy and comprises a pedestal or base part 21, a leg part 29 provided at the bottom of base part 21 and a spring part 18 provided at the top. Contact pins 20 are inserted, individually, from above into respective slits 8 prior to placing cover 17 on base 16 and, as shown in FIGS. 3a through 3c, are fixed to base 16 with leg part 29 projecting out of the bottom of the base 16. Because of such a construction, socket 2 as a whole can be fixed to a printed substrate by connecting leg parts 29 to the printed substrate. Contact heads 22 and trigger portions 23 are provided at distal tips of spring parts 18 and, in the state where cover 17 has been raised, trigger portions 23 are separated from cam member 13 of cover 17. When the contact pins are inserted into slits 8, contact heads 22 have a bias inwardly and downwardly toward adapter 15. When cover 17 is in the raised position, contact heads 22 touch the surface of the adaptor 15 because of this spring bias. When cover 17 is pressed down from the FIG. 3a position, in opposition to the spring force of the spring between cover 17 and base 16, cam member 13 is moved down engaging and sliding against trigger portions 23. Spring parts 18 are pushed outwardly and contact heads 22 are separated from the surface of adaptor 15 moving upwardly and outwardly, as shown in FIG. 3b.

Accordingly, during the testing operation, semiconductor device is placed into the seating portion 14 through the opening that has been provided in cover 17. As shown in FIGS. 1a and 1b, blocking member 3 has an inclined surface which serves to help guide the terminal leads 302 of device 300 as the device 300 is positioned onto the top surface of adapter 15. At the top of blocking member 3, there is provided an inclined surface 6 directed toward the seating portion 14 and, in connection with the dropping of semiconductor device 300, the tips of the terminal leads 302 maintain contact with the inclined surface 6 and the semiconductor device 300 is guided onto the top surface of adaptor 15 to be received in seating portion 14 as shown in FIG. 1a. Stop member 4 forms a lip on adaptor 15 arranged between the recessed seat for the tip of terminal leads 302 of the semiconductor device 300 and slit section 9 so that a semiconductor device 300 that is received on adaptor 15 has its movement in the horizontal direction limited by such stop member 4, thereby effecting desired positioning of the semiconductor device. When the downward force on the cover is released and cover 17 moves upwardly by the spring force, contact heads 22 engage respective terminal leads 302 due to the spring force of spring parts 18, thereby bringing about a state in which a test can be conducted. Upon the completion of testing, cover 17 is depressed causing, trigger portions 23 to be pushed outwardly by cam member 13 and contact heads 22 to be separated from terminal leads 302, as shown in FIG. 3b, with contact heads 22 being received in slits 8. Semiconductor device 300 can then be removed to be exchanged with another semiconductor device.

During the removal of the semiconductor devices, there are instances where a semiconductor device 300 is raised askew or is shifted in the horizontal direction as shown in FIG. 3c, however, blocking member 3 at the top of the slit section 9, servers to prevent a terminal lead 302 from being entangled in a slit 8.

Figure 2B:
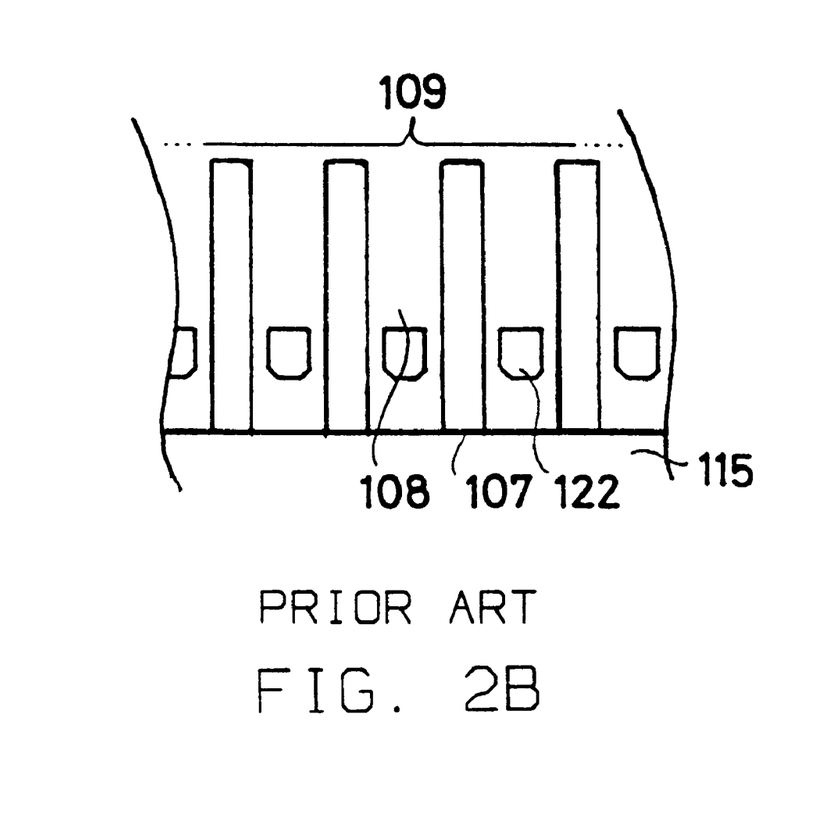

According to the prior art, on the other hand, as described above, when cover 177 has been pushed down and contact heads 122 have been received in slits 108, there is an opening remaining in slits 108 at a location above each contact head 122 (see FIG. 2b), with a result that the tip of a terminal lead 302 may become entangled at the time of insertion or removal of semiconductor device 300. Further, in prior art sockets, there are cases where the tip of a terminal lead 302 becomes caught in a slit 108 at a location which is below contact heads 122 in slits 108. In each case, if an attempt is made to forcefully extract it, the terminal lead 302 may bend or it may become impossible to remove the semiconductor device 300.

In a socket made according to this invention, however, the terminal leads are guided by surface 6 of blocking member 3 and are prevented from becoming caught in the gap of slit 8. In addition, the terminals are prevented from becoming caught in the bottom of slit 8 by stop member 4. Accordingly, terminal leads 302 will not be subject to bending and the semiconductor device 300 can be smoothly inserted or withdrawn.

It should be understood that the preferred embodiment has been described by way of illustrating the invention but that this invention includes various modifications and equivalents to the disclosed embodiment. For example, adaptor 15 has been used in the above described socket 2, however, this invention is not limited to that construction. Moreover, the blocking member can be formed separately from slit section 9 or integrally with it. If desired, stop member 4 can be provided on adaptor 15, as shown, or on base 16. In the above embodiment, the slit forming means or partitions have been shown integrally formed with the base of the socket. It will be realized, however, that the slit forming means can be a thin sheet-like insulating film and that a positioning groove could be formed on the base for insertion thereinto. In addition, the slit forming means can comprise an insulating film adhered by means of an adhesive either to one or both sides of the contact pin. In such case, there would be no need to form a positioning groove on the base. In the case where a slit-forming means is used which is not formed integrally with the base, a positioning groove to catch each slit forming means, to cite an example, can be formed on the surface of the blocking member for blocking of the top part of the slit forming means.

In general, blocking member 3 is positioned adjacent seating portion 14 of socket 2 and at the top of slit section 9 in which contact heads 22 of contact pins 20 are received. Even if a terminal lead 302 engages the slit section 9 in connection with the loading of the semiconductor device, the terminal lead will not become entangled in a slit 8 because of blocking member 3. Further, stop member 4 is provided in the vicinity of the seated portion of the tip of terminal lead 302 so as to prevent the terminal lead from becoming entangled in a slit 8. By means of the invention, entanglement of the tips of the terminal leads in the slits with concomitant bending of the terminal leads is avoided, with a result that semiconductor devices can be smoothly inserted or extracted. The inclined surface of the blocking means that has been provided at the top of the slit section further facilitates the insertion operation of the semiconductor device which becomes easier to carry out and which lessens the possibility of bending of terminal leads at the time of an insertion. It is intended that the invention include all modifications and equivalents of the disclosed embodiment falling within the scope of the appended claims.

What is claimed:

1. Socket apparatus for removably receiving an electrical package having a plurality of terminal leads for making electrical connection with the terminal leads of the electrical package comprising a base formed of electrically insulating material having first and second opposed longitudinally extending sides, a cover having a centrally disposed electrical package receiving opening movably mounted on the base between raised and lowered positions, a spring for urging the cover toward the raised position, an electrical package seating portion on the base vertically aligned with the opening in the cover, parallel extending partitions forming a plurality of slits extending upwardly from the base along each of the first and second sides to a top end, a plurality of spring contact members mounted in the base with a contact member received in each slit, each contact member having a contact head portion movable between a first electrical package terminal lead engaging position when the cover is in the raised position and a second recessed position when the cover is in the lowered position, and a blocking member, engaged with the base member, disposed at the top end of the slits blocking the top end of the slits, said blocking member having an inclined surface sloping toward the seating portion for guiding the electrical package being loaded in the socket.

2. Socket apparatus according to claim 1 in which the recessed position of the contact heads is disposed within the slits.

3. Socket apparatus according to claim 1 further comprising a stop member disposed between the seating portion and the slits.

4. Socket apparatus according to claim 3 in which the stop member is a lip extending upwardly from the seating portion contiguous with the slits.

5. Socket apparatus according to claim 1 in which the partitions are formed integrally with the base.

6. Socket apparatus according to claim 1 in which the blocking member is formed integrally with the base.

* * * * *